United States Patent
Hellekson et al.

(10) Patent No.: US 6,917,099 B2
(45) Date of Patent: Jul. 12, 2005

(54) DIE CARRIER WITH FLUID CHAMBER

(75) Inventors: Ronald A. Hellekson, Eugene, OR (US); Chien-Hua Chen, Corvallis, OR (US); William R Boucher, Corvallis, OR (US); Joshua W. Smith, Corvallis, OR (US); David M Craig, Albany, OR (US); Gary J. Watts, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 10/650,572

(22) Filed: Aug. 27, 2003

(65) Prior Publication Data

US 2005/0045974 A1 Mar. 3, 2005

(51) Int. Cl.$^7$ ................................................ H01L 23/02
(52) U.S. Cl. ........................ 257/678; 257/698; 257/699; 257/712; 257/713; 257/714; 257/717; 257/718; 257/722
(58) Field of Search ................................. 257/678, 698, 257/699, 712, 713, 714, 717, 718, 722

(56) References Cited

U.S. PATENT DOCUMENTS

| | | | | | |
|---|---|---|---|---|---|
| 5,016,090 A | * | 5/1991 | Galyon et al. | ............... | 257/714 |
| 5,023,695 A | * | 6/1991 | Umezawa et al. | .......... | 257/714 |
| 5,270,572 A | * | 12/1993 | Nakajima et al. | ........... | 257/714 |
| 5,514,906 A | * | 5/1996 | Love et al. | ................ | 257/712 |
| 5,707,850 A | * | 1/1998 | Cole | ......................... | 435/239 |
| 6,299,300 B1 | * | 10/2001 | Silverbrook | ................ | 347/93 |
| 6,556,261 B1 | | 4/2003 | Krusius et al. | | |

OTHER PUBLICATIONS

LCOS 2001 Industry Report; published Jun., 2001; Insight Media.

* cited by examiner

Primary Examiner—Jasmine J. Clark (57) ABSTRACT

A die carrier has a body with a primary surface adapted for attachment to a substrate die. The body at least partially defines a fluid chamber. A fill port and an evacuate port are each fluidically connected to the fluid chamber.

39 Claims, 6 Drawing Sheets

DIE CARRIER WITH FLUID CHAMBER

BACKGROUND

The design, manufacture, assembly and packaging of micro-electro-mechanical system (MEMS) devices raises various issues. Some MEMS devices fabricated on a substrate such as a silicon die, for example, may be subject to temperature increases during use. Fluidic MEMS devices may also experience additional stresses due to the thermal expansion of fluid. In an optical mirror array MEMS device, for example, light intensity may be such that a substantial temperature rise can affect the performance of the mirrors unless heat is removed. Other sources of heat may also be present in a MEMS device. The degree of temperature increase tolerated in a MEMS device package may depend on the fluid, the package materials, the volume of fluid used or other factors.

A MEMS device on a silicon die may include components which may be subject to damage during assembly. For instance, devices such as suspended mirrors or cantilevered structures may be fragile and subject to risk of damage during assembly. The cost of packaging a MEMS device may be a significant portion of the cost of manufacture for a MEMS device.

DETAILED DESCRIPTION

In the following detailed description and in the several figures of the drawing, like elements are identified with like reference numerals.

Figure 1:
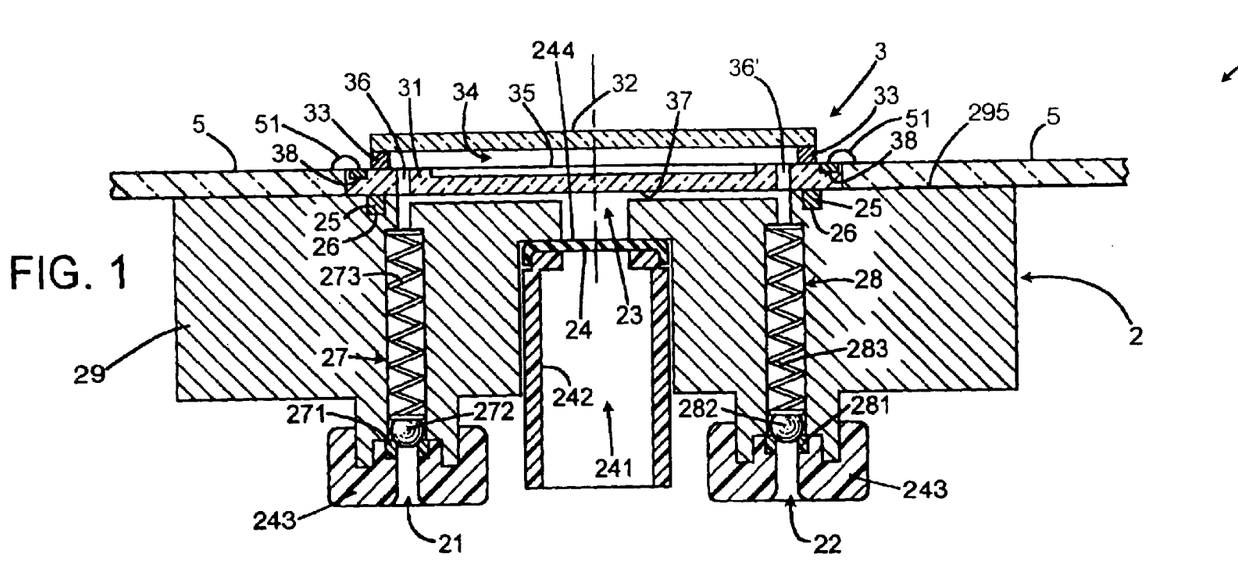
FIG. 1 illustrates an exemplary embodiment of a MEMS assembly with a MEMS sub-assembly mounted on a die carrier and electrically connected to a printed circuit board.

FIG. 1 illustrates an exemplary embodiment of a MEMS assembly 1. The assembly includes a die carrier 2 adapted to receive and to be joined to a substrate die 31. In an exemplary embodiment, the substrate die 31 may be fabricated from silicon, gallium arsenide, sapphire, glass, ceramic, metal or other suitable material. The substrate die 31 may be included in a MEMS sub-assembly 3. The MEMS sub-assembly may include the substrate die 31 and a cover plate 32 joined to the substrate die 31 by a bond 33. The bond 33 may be in the form of a bond ring.

Figure 2:
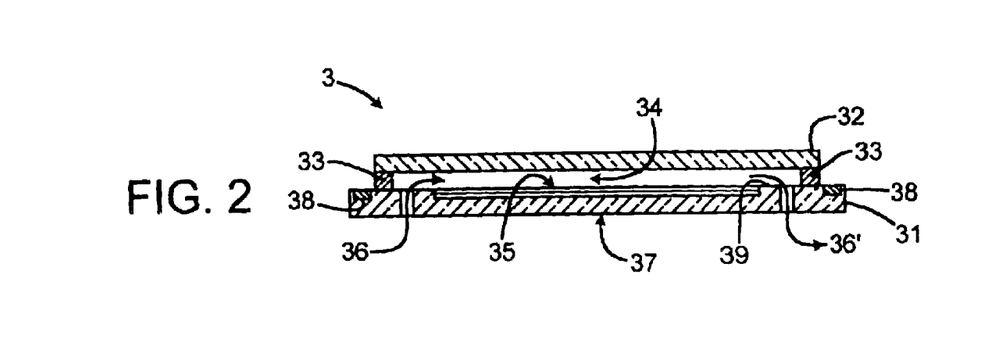
FIG. 2 illustrates an exemplary embodiment of a singulated MEMS sub-assembly.

The MEMS sub-assembly 3 may be assembled at the wafer level and singulated prior to being joined to the die carrier 2. FIG. 2 illustrates an exemplary embodiment of a MEMS sub-assembly including a substrate die 31 and a cover plate 32 joined to the substrate die 31 by a bond 33. The bond 33 may comprise adhesives, frits, eutectic solders, solder mask materials, anodic bonding and/or other materials suitable for bonding a suitable cover plate to the substrate die. The bond material 33 may be placed on the substrate die 31 using lithographic methods, plating, screen printing, deposition and etch, or other suitable methods. The cover plate may be joined to the substrate die at the wafer level and a plurality of MEMS sub-assemblies may singulated from a single wafer prior to being joined to a die carrier. The wafer may be, for example, a silicon wafer or other suitable wafer.

A MEMS sub-assembly may include an inner cavity. In the exemplary embodiments illustrated in FIGS. 1 and 2, the cover plate 32, the substrate die 31 and the bond 33 define an inner cavity 34. The bond 33 may act as a spacer, holding the upper surface of the substrate die 31 and the underside of the cover plate a distance apart. The bond 33 may enclose the inner cavity defined by the cover plate 32, the substrate die 31 and the bond 33.

In an exemplary embodiment, a MEMS structure is fabricated on a surface 39 (FIG. 2) of the substrate die 31. The MEMS device may be fabricated on the surface by techniques such as, for example, deposition, photolithography and etching processes and removal of sacrificial support structures. Movable features may be produced on the surface of the substrate, die or wafer. In the exemplary embodiments illustrated in FIGS. 1 and 2, a MEMS structure 35 is on the upper surface 39 of the substrate die 31. The MEMS structure may be a fluidic MEMS structure such as a mirror array, a lab-on-chip, an optical switch or other fluidic MEMS application. A lab-on-chip may integrate fluid handling, chemical sensors and/or electronics to perform analytical processes. In the alterative, the MEMS structure may be a non-fluidic MEMS structure. In an exemplary embodiment, for instance in the case of a mirror array, the cover plate 32 may be a optical window or aperture. The cover plate may comprise plastic, metal or metal alloys such as Kovar (TM), ceramic or glass.

In certain exemplary embodiments, it may be desirable to fill the inner cavity of a MEMS sub-assembly with fluid. Fluid may be introduced into the inner cavity through a pathway through or around the substrate die. In the exemplary embodiment illustrated in FIG. 2, two through holes 36, 36' are provided through the substrate die 31. The holes 36, 36' may be formed, for example, by drilling, laser drilling, chemical etching, anisotropic etching, reactive ion etching or other suitable methods. The holes provide a fluid connection or path from the inner cavity 34 to the underside 37 of the substrate die. The inner cavity and the underside of the substrate die may be said to be in fluid connection, in fluid communication or fluidically connected, whether or not fluid is present, where fluid when present may flow from one to the other directly or through an intermediate fluid pathway.

The exemplary MEMS assembly 1 of FIG. 1 includes the MEMS sub-assembly 3 with an inner cavity 34 in fluid communication with a fill port 21 and an evacuate port 22 of the die carrier 2 through a plurality of holes 36, 36'. The inner cavity 34, the fill port 21 and the evacuate port 22 are also in fluid communication with a fluid chamber 23 defined by the underside 37 of the substrate die, the die carrier 2 and a compliant diaphragm 24 arranged to accommodate thermal expansion of fluid in the fluid chamber. In some applications, the fluid used to fill a fluidic MEMS device may have a coefficient of thermal expansion which is sufficiently high such that fluid expansion may otherwise not be accommodated by the MEMS packaging structure. A surface 244 of the diaphragm 24 may be in fluid communication with the fluid chamber 23. The diaphragm may comprise elastomers, thin metals, pleated metals, or flexible plastics. Thin metals may provide hermeticity and pleated metals may provide hermeticity with high volume capacity and may be designed to provide expansion. It is understood that although one port is referred to as a fill port and the other as an evacuate port, the two ports may be interchangeable in some embodiments; that is a port may serve as either a fill port or an evacuate port depending on how it is arranged during fluid fill.

Fluids suitable, for use in a MEMS device may comprise aromatic solvents, water, mixtures of water and water-soluble organics, ionic materials dissolved in water, pigmented fluids, colloidal suspensions and/or combinations thereof. Specific examples may include, for example, 1,1 diphenylethylene, organosilianes such as, for example, 3-chloropropyl triethoxysilane, perfluoroethers such as, for example, Galden HT-100 (TM), silicones and silanes such as, for example, polymethylphenylsiloxane and polydimethylsiloxane.

The fluid chamber 23 (FIG. 1) is fluidically connected to or in fluid communication with the fill port 21 and the evacuate port 22. In an alternate embodiment (not shown) the fluid chamber may not be in fluid communication with an inner cavity of a MEMS sub-assembly where the substrate die is not provided with fluid pathways through or around the substrate die.

The MEMS sub-assembly may be joined to a primary surface 295 of the die carrier by adhesive 25 which may be disposed within a recess 26 in the die carrier.

The exemplary embodiment of FIG. 1 includes a first check valve 27 arranged in the fill port 21 and a second check valve 28 arranged in the evacuate port 22. The check valves 27 and 28 are arranged to prevent fluid flow out from the chamber through the fill port and evacuate port. The check valves 27 and 28 may include a seat 271, 281, which may be elastomeric, a ball 272, 282, which may be rigid and may comprise ceramic, glass or stainless steel, and/or a spring 273, 283. The check valves 27, 28 may be installed through the fill port and evacuate port and held in place by, for example, clamp rings 243. Clamp rings may comprise any suitable materials which may include, for example, plastic or metal. The clamp rings may be secured by a press fit, threaded fit, adhesive or other suitable method. Suitable check valves in other exemplary embodiments may comprise flexible flaps or any other suitable check valve arrangement.

In certain applications, it may be desirable to minimize the presence of air bubbles when providing fluid in a MEMS assembly, the fluid chamber and/or an inner cavity of a MEMS sub-assembly. In the exemplary embodiment of FIG. 1, for example, the fill port 21, evacuate port 22 and check valves 27, 28 may be used in various schemes to manage air during the fill process and/or reduce the risk of the formation of air and/or gas bubbles. Fluid may be introduced into the chamber by attaching a fluid source at the inlet to the fill port 21. The check valve may be opened by sufficient positive pressure of the fluid source or by operating the check valve with a probe to hold the ball off its seat. The check valve operates to permit fluid flow into the chamber through the fill port. The pressurized fluid will cause any air or gasses contained within the chamber to evacuated out through the evacuate port and check valve. The evacuate check valve is held open by a probe during the fill process.

In other embodiments, the evacuate port may be coupled to a low pressure or vacuum source to draw any air, gasses or fluid out from the chamber and the inner cavity during the fill process. The vacuum at the evacuate port will help ensure that gas and air is evacuated from the chamber. Negative pressure in the chamber by the use of a vacuum source at the evacuate port could draw fluid into the chamber. In the alternative, a vacuum source at the evacuate port could be used in conjunction with a pressurized fluid source at the fill port.

A MEMS assembly or package with MEMS device may be attached to a printed circuit board (PCB). In FIG. 1, for example, an exemplary embodiment of the MEMS assembly 1 with the MEMS sub-assembly 3 joined to a die carrier 2 and electrically connected to a PCB 5. The PCB may be a rigid printed circuit or a flexible printed circuit. The electrical connection 51 between the PCB and bonding pads 38 of the MEMS may be any suitable technique, including physical contact, solder or other techniques which may include gold wire bonding, aluminum wire bonding, TAB (tape automated bonding) bonding, or flip chip bonding.

Figure 3A:
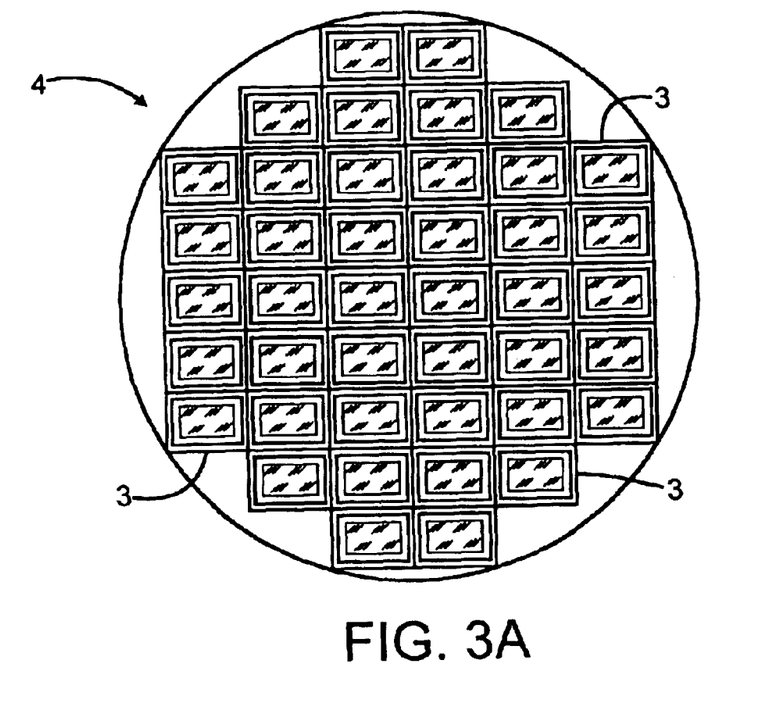
FIGS. 3A and 3B illustrate exemplary embodiments of a wafer with a plurality of MEMS disposed on its surface.
Figure 3B:
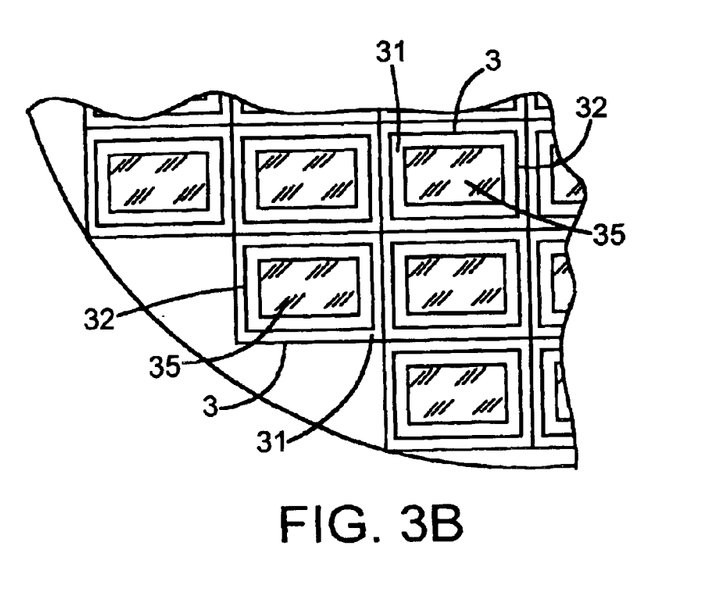

FIGS. 3A and 3B illustrate an exemplary embodiment of a wafer 4 used in the production of MEMS sub-assemblies. The wafer 4 includes a plurality of die portions 31, separate MEMS devices 35 being disposed on each die portion 31. In the exemplary embodiments of FIGS. 3A and 3B, the MEMS devices 35 are mirror arrays 35. In an exemplary embodiment, the wafer may be a silicon wafer. Cover plates 32 may be attached at the wafer level. The MEMS sub-assemblies 3 may be singulated from the wafer, for example, by sawing. Assembling the sub-assemblies 3 with the cover plate 32 bonded to the substrate die 31 at the wafer level may protect the MEMS devices 35 on the substrate die 31 during any subsequent assembly steps and may improve the precision of placing the bonding material on the substrate die. In the case of a mirror array, bonding an optical window or aperture to the substrate die early in the assembly process may protect the fragile mirror array. The completed and enclosed mirror arrays may be singulated for attachment to die carriers. The cover plate may provide some protection to the substrate die during assembly. In the alternative, the substrate die could be joined to the die carrier prior to bonding the cover plate, window or aperture to the substrate die.

Figure 4:
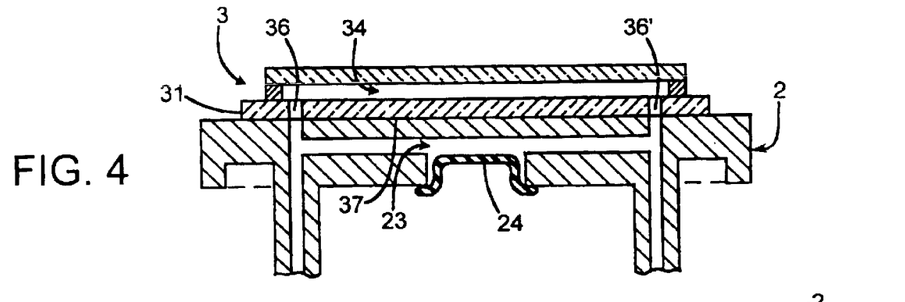
FIG. 4 illustrates an exemplary embodiment of a MEMS assembly with a die carrier, a die and a cover plate.

FIG. 4 illustrates an alternate, exemplary embodiment with a fluid chamber 23 defined by the die carrier 2 and a compliant diaphragm 24. The fluid chamber 23 is in fluid communication with the inner cavity 34 of a MEMS sub-assembly 3 through holes 36, 36' in the substrate die 31. The underside 37 of the substrate die faces the primary surface of the die carrier and is not in fluid communication with the fluid chamber 23. In a further, alternate embodiment (not shown) the fluid chamber may not be in fluid communication with an inner cavity of a MEMS sub-assembly where there are no holes in the substrate die.

Figure 5:
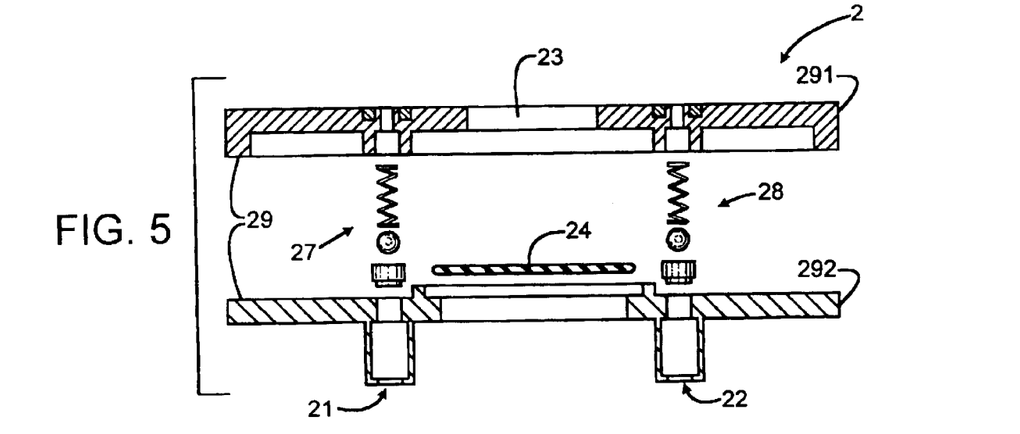
FIG. 5 is an exploded cross-section view of an exemplary embodiment of a die carrier with a surface portion and a fill plate.

The body 29 of the die carrier may be formed in a single piece (FIG. 1) or from a plurality of pieces assembled to form the die carrier. FIG. 5 illustrates an exploded, cross-sectional view of an exemplary embodiment of a die carrier 2 having a two-piece body 29 with a surface member 291 adapted to receive and for joining to a MEMS sub-assembly and a fill plate 292 with the fill port 21 and evacuate port 22. The diaphragm 24 may be arranged on the fill plate 292. The fluid chamber 23 may be defined by the surface portion 291, the fill plate 292, the diaphragm 24 and/or the underside of a MEMS sub-assembly (not shown) joined to the surface member.

In an exemplary embodiment, a die carrier may comprise molded ceramic, metal which may be machinable, aluminum, electroless plated aluminum, copper, molded plastic or any other material suitable for receiving a substrate die. A die carrier may have a coefficient of thermal expansion similar to the material comprising the substrate die. It may be desirable for a die carrier to comprise material which is impermeable to fluid and/or vapor, which provides hermeticity, and/or provides good fluid and/or vapor retention. In the case of a multi-piece die carrier, a surface member 291 and a fill plate 292 (FIG. 5) may comprise the same materials. Alternatively, a surface member 291 may comprise a material with a coefficient of thermal expansion which is more closely matched to the coefficient of thermal expansion of the substrate die than is the coefficient of thermal expansion of the fill plate 292. Where a lower thermal conductivity surface member is less easily formed into complicated structural features than a higher coefficient of thermal expansion fill plate, complicated structural features of the die carrier may be formed in the fill plate thereby simplifying manufacture of the die carrier. For example, where surface member 291 comprises ceramic, the fill plate 292 may comprise plastic or metal. The fill port 21, evacuate port 22 and any surface area extending elements 293, 294 (FIG. 7) may be formed in the fill plate.

The check valves 27, 28 and/or the diaphragm 24 in the exemplary embodiment of FIG. 5 may be installed in the die carrier 2 prior to attaching the fill plate 292 to the surface member 291 and may be held in place without clamp rings between the surface member 291 and the fill plate 292. In the exemplary embodiment of FIG. 1, which has a unitary body 29, the diaphragm 24 may be placed through an access opening 241 in the die carrier 2 and held in place with, for example, a clamp ring 242. The clamp ring 242 may comprise any suitable materials which may include, for example, plastic or metal. The clamp ring may be secured by a press fit, threaded fit or by adhesive or other suitable method for securing and sealing the diaphragm.

Figure 6:
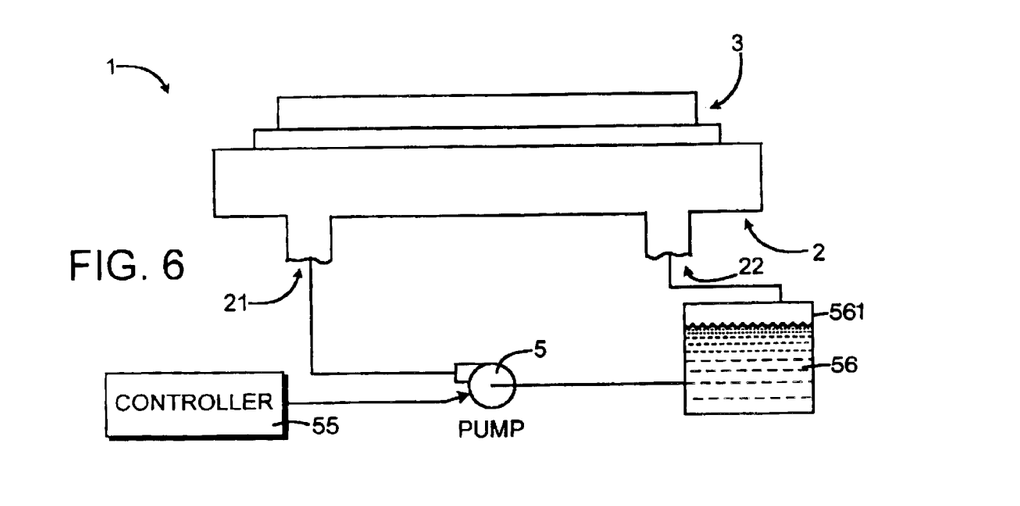
FIG. 6 illustrates an exemplary embodiment of a MEMS assembly with a pump providing fluid flow.

In an exemplary embodiment, the fill port and evacuate port may be sealed after filling the fluid chamber and/or inner cavity with fluid so that no fluid is added to the system and no fluid is removed from the system after sealing. In other exemplary embodiments, a fluid flow may be provided from outside the system, into the system and through the fluid chamber and/or the inner cavity and then back out from the system. The fluid flow may improve heat transfer away from the MEMS device. FIG. 6 illustrates an exemplary embodiment with a fluid pump 5 arranged to provide pressurized fluid to a fluid source at the fill port 21. The fluid passes through a fluid chamber and/or an inner cavity and out the evacuate port 22. The fluid may be recirculated or may pass through once, for example, where a lab-on-chip continuously monitors a stream of fluid for process control or contamination, for example. In embodiments with flow through the MEMS device, check valves may be arranged to allow fluid flow in through the fill port and out through the evacuate port. A controller 55 may control the pump to maintain desired pressure and fluid flow. The pump may draw fluid 56 from a fluid reservoir 561 and fluid evacuated through the evacuate port 22 may be returned to the reservoir 561.

Figure 7:
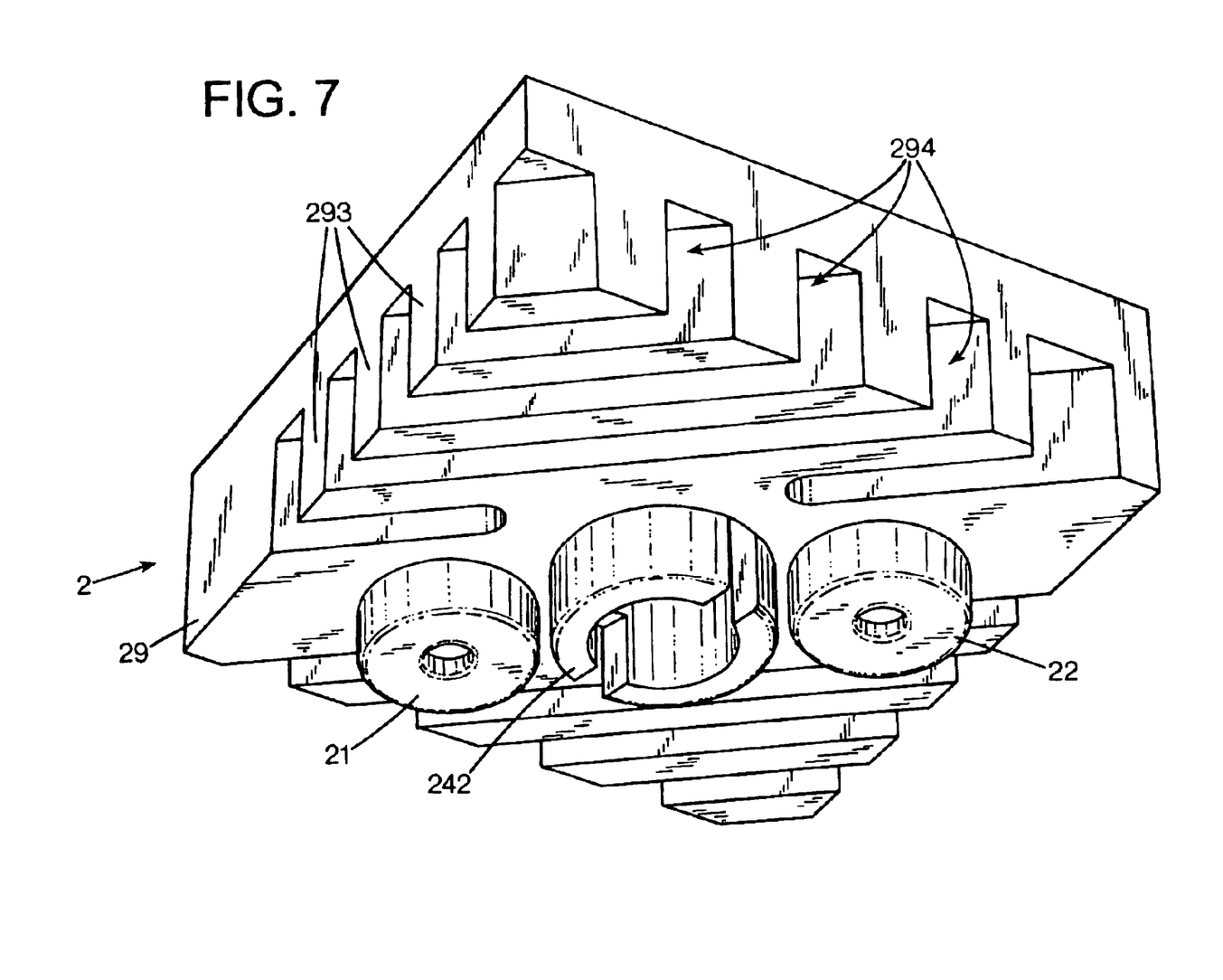
FIG. 7 illustrates an exemplary embodiment of a die carrier with a body with a high surface area.

The die carrier may serve as a heat sink to draw heat away from the substrate die. The die carrier may therefore be provided with a heat conductivity greater than that of the substrate die. The fluid in the die carrier chamber may also have a higher heat conductivity than the substrate die. Fluid flow through the chamber and or an inner cavity of the MEMS may also remove heat from the MEMS. The shape of the die carrier and/or die carrier body may be configured to improve the rate of heat transfer. For example, the die carrier may have a shape with a large surface area relative to the size of the die carrier. Such a die carrier may comprise surface area extending elements which may include, for example, external vanes or channels, posts, thin sheeting, which may be, for example, metal sheeting, fan-like folds or other configurations which increase surface area to improve heat transfer from a body of a die carrier. For example, FIG. 7 illustrates an exemplary embodiment of a die carrier 2 with a fill port 21 and evacuate port 22 and clamp ring 242 for holding a diaphragm in place. The underside of the die carrier body 29 defines a plurality of external vanes 293 and channels 294.

Figure 8:
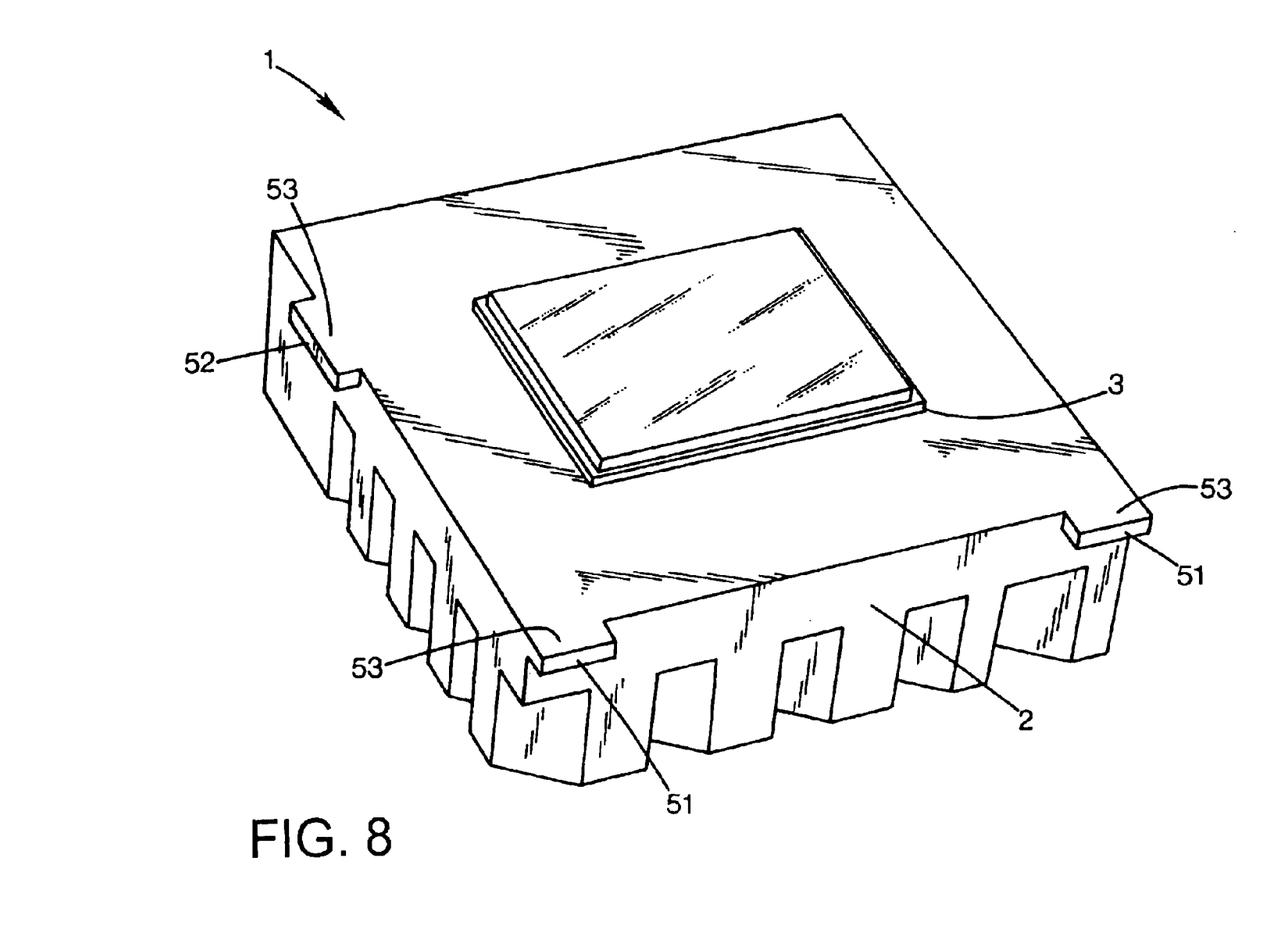
FIG. 8 illustrates an exemplary embodiment of a MEMS device with a die carrier with reference data.

The MEMS device may be joined to the die carrier using a precision alignment process. The precision alignment is performed, in part, using at least a reference datum. The reference datum may be provided on the die carrier. The precision alignment may be performed using optical alignment techniques. In an exemplary embodiment, a die carrier 2 has x, y and z reference data structures 51, 52, 53, respectively as shown in FIG. 8. Reference data may be a surface of an extension from the body, as shown in FIG. 8. Reference data may be provided in any suitable manner and may include, for example, a suitable feature on the body which can be sensed by an optical alignment system and from which the proper die location may be determined. The substrate die or MEMS subassembly 3 may be optically aligned and bonded to the die carrier 2 in reference to the precision reference datum locations 51–53. The reference data may also be used in aligning and mounting the MEMS assembly 1 to an application, circuit or other system. Fiducial reference points on the substrate die may also assist in the optical alignment of the substrate die on the surface of the die carrier. Such fiducials may, for example, be located at diagonally opposite corners of a substrate die.

Figure 9:
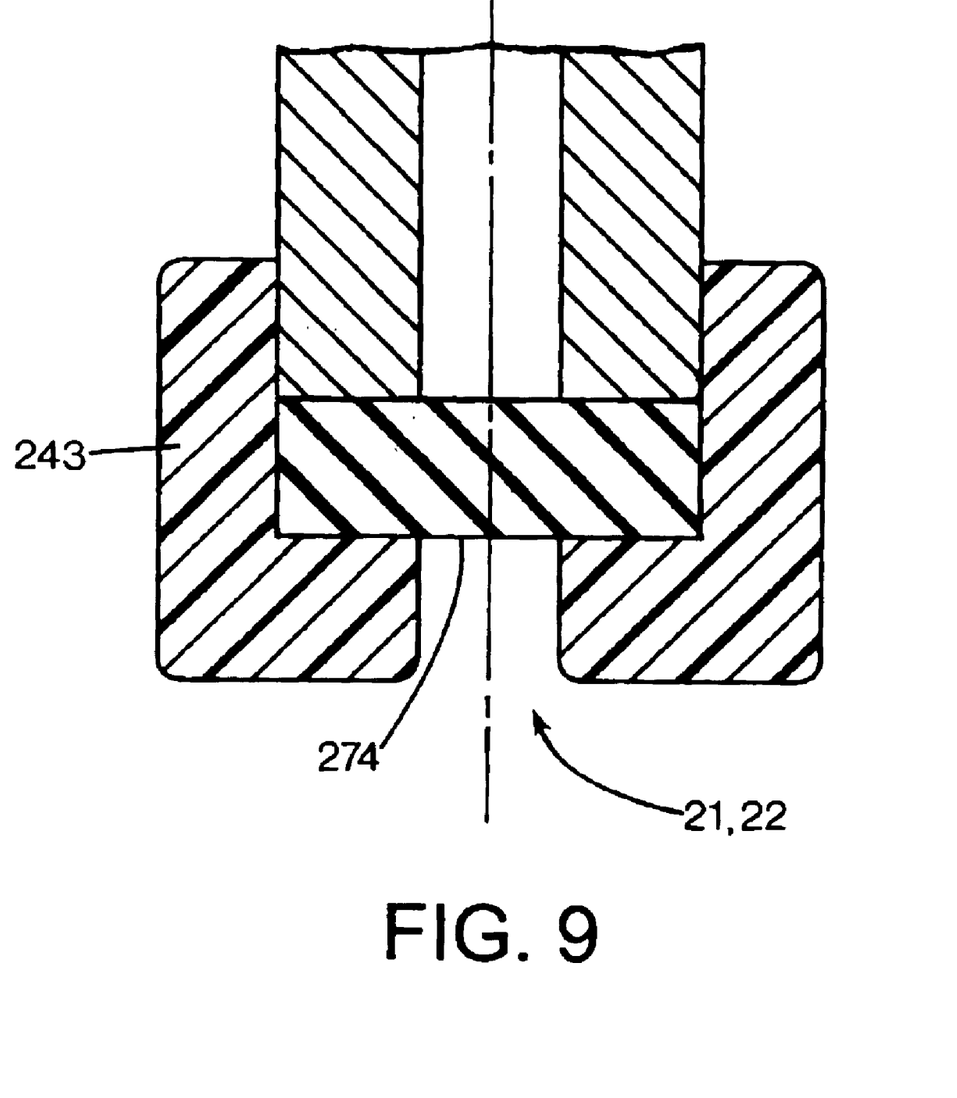
FIG. 9 illustrates an exemplary embodiment of a septum arranged at a fill port or evacuate port.

In an alternate exemplary embodiment illustrated in FIG. 9, a septum 274 arrangement at either one or both of the fill port 21 or the evacuate port 22 may be used in place of one or both of the check valves. Fluid may be inserted into the chamber through a needle inserted through a septum 274 at a fill port 21. Air, gas and/or fluid may be evacuated through a needle inserted through a septum 274 at an evacuate port 22. The septum 274 may provide a seal which may prevent fluid from leaving the fluid chamber through the fill port 21 or evacuate port 22 after the needle is removed. A septum 274 may be held in place by a clamp ring 243. Exemplary septa may comprise elastomers, rubber, cork, gels and/or soft plastics.

It is understood that the above-described embodiments are merely illustrative of the possible specific embodiments which may represent principles of the present invention. The principles described and claimed here may be applicable to specific embodiments not expressly disclosed here. Other arrangements may readily be devised in accordance with these principles by those skilled in the art without departing from the scope and spirit of the invention.

What is claimed is:

1. A die carrier comprising:
   a body having a primary surface adapted for attachment to a substrate die and at least partially defining a fluid chamber;
   a fill port fluidically connected to the fluid chamber;
   an evacuate port fluidically connected to the fluid chamber; and
   a check valve arranged in at least one of the fill port or the evacuate port.

2. A die carrier comprising:
   a body having a primary surface adapted for attachment to a substrate die and at least partially defining a fluid chamber;
   a fill port fluidically connected to the fluid chamber;
   an evacuate port fluidically connected to the fluid chamber; and
   a compliant diaphragm arranged in the body, the diaphragm having a surface in fluid communication with the fluid chamber.

3. A die carrier comprising:
   a body having a primary surface adapted for attachment to a substrate die and at least partially defining a fluid chamber;
   a fill port fluidically connected to the fluid chamber; and
   an evacuate port fluidically connected to the fluid chamber;

wherein the die carrier has a heat conductivity greater than the substrate die.

4. A die carrier comprising:
a body having a primary surface adapted for attachment to a substrate die and at least partially defining a fluid chamber;
a fill port fluidically connected to the fluid chamber;
an evacuate port fluidically connected to the fluid chamber; and
a first check valve arranged in the fill port and a second check valve arranged in the evacuate port.

5. A die carrier comprising:
a body having a primary surface adapted for attachment to a substrate die and at least partially defining a fluid chamber;
a fill port fluidically connected to the fluid chamber; and
an evacuate port fluidically connected to the fluid chamber;
wherein the body comprises surface area extending elements.

6. The die carrier according to claim 5, wherein the surface area extending elements comprise at least one of external vanes or channels.

7. A die carrier comprising:
a body having a primary surface adapted for attachment to a substrate die and at least partially defining a fluid chamber;
a fill port fluidically connected to the fluid chamber;
an evacuate port fluidically connected to the fluid chamber; and
a reference datum.

8. A die carrier comprising:
a body having a primary surface adapted for attachment to a substrate die and at least partially defining a fluid chamber;
a fill port fluidically connected to the fluid chamber;
an evacuate port fluidically connected to the fluid chamber; and
a septum arranged in at least one of the fill port or the evacuate port.

9. A die carrier comprising:
a body having a primary surface adapted for attachment to a substrate die and at least partially defining a fluid chamber;
a fill port fluidically connected to the fluid chamber; and
an evacuate port fluidically connected to the fluid chamber;
wherein the body comprises a surface portion with a primary surface adapted for attachment to a substrate die and a fill plate comprising a fill port and an evacuate port, the surface portion having a first coefficient of thermal expansion, the fill plate having a second coefficient of thermal expansion and the substrate die having a third coefficient of thermal expansion which closer to the first coefficient of thermal expansion than to the second coefficient of thermal expansion.

10. A fluidic MEMS device, comprising:
a MEMS sub-assembly comprising a substrate die with a MEMS structure fabricated on an upper surface of the substrate die and a cover plate;
a die carrier comprising a body having a primary surface and at least partially defining a fluid chamber, a fill port fluidically connected to the fluid chamber, and an evacuate port fluidically connected to the fluid chamber;
wherein the MEMS sub-assembly is attached to the primary surface of the die carrier.

11. The fluidic MEMS device according to claim 10 comprising a check valve arranged in at least one of the fill port or the evacuate port.

12. The fluidic MEMS device according to claim 10, further comprising:
a compliant diaphragm arranged in the body and having a surface in fluid communication with the fluid chamber.

13. The fluidic MEMS device according to claim 10, comprising means for removing heat from the MEMS sub-assembly.

14. The fluidic MEMS device according to claim 10, wherein the cover plate is attached to the substrate by a bond.

15. The fluidic MEMS device according to claim 14, wherein the substrate die, the cover plate and the bond define an inner cavity, the inner cavity being in fluid communication with the fluid chamber through a pathway from an underside of the substrate die to an upper surface of the substrate die.

16. The fluidic MEMS device according to claim 15, wherein:
the inner cavity is in fluid communication with the fluid chamber through at least one of a plurality of a plurality of pathways from the underside of the substrate die to the upper surface of the substrate die.

17. The fluidic MEMS device according to claim 10, wherein the body comprises surface area extending elements.

18. The fluidic MEMS device according to claim 17, wherein the surface area extending elements comprise at least one of vanes or channels.

19. The fluidic MEMS device according to claim 10, comprising a septum arranged in one of the fill port or the evacuate port.

20. A method of filling a fluidic MEMS device with fluid, comprising:
connecting a fluid source at a fill port of the MEMS device;
providing a differential pressure between the fill port and an evacuate port of the MEMS device, causing fluid from the fluid source to be drawn into the MEMS device and air and gas from the MEMS device to be evacuated through the evacuate port.

21. The method of claim 20, wherein providing the differential pressure comprises providing fluid under pressure at the fill port.

22. The method of claim 20, wherein providing the differential pressure comprises providing a vacuum at the evacuate port.

23. The method of claim 20, wherein providing the differential pressure comprises providing fluid under pressure at the fill port and providing a vacuum at the evacuate port.

24. A method of assembling a fluidic MEMS device comprising:
singulating a MEMS sub-assembly from a wafer-level MEMS assembly;
joining the MEMS sub-assembly to a die carrier, the die carrier comprising a fluid chamber, a fill port and an evacuate port.

25. The method of claim 24, wherein the MEMS sub-assembly comprises a substrate die, a bond and a cover plate, wherein the cover plate, the substrate die and the bond define an inner cavity.

26. The method of claim 24, wherein the joining comprises:

joining the MEMS sub-assembly to the die carrier by adhesive.

27. The method of claim 26, wherein the adhesive is disposed in a recess in the die carrier.

28. The method of claim 24, comprising:
aligning the MEMS sub-assembly with the die carrier with an alignment process using at least a reference datum on the die carrier.

29. A display device, comprising:
a substrate die with an upper surface;
a mirror array fabricated on the upper surface of the substrate die; and
an optical aperture attached to the substrate die by a bond;
wherein the substrate die is attached to a primary surface of a die carrier, the die carrier comprising a body defining a fluid chamber, a fill port fluidically connected to the fluid chamber, and an evacuate port fluidically connected to the fluid chamber.

30. The display device according to claim 29, comprising a check valve arranged in one of the fill port or the evacuate port.

31. The display device according to claim 29, further comprising:
a compliant diaphragm arranged in the body and having a surface in fluid communication with the fluid chamber.

32. The display device according to claim 29, wherein the die carrier has a heat conductivity greater than the substrate die.

33. The display device according to claim 29, comprising:
an inner cavity defined by the substrate die, the optical aperture and the bond; and
a pathway from an underside of the substrate die to an upper surface of the substrate die, the inner cavity being in fluid communication with the fluid chamber through the pathway.

34. The display device according to claim 33, wherein the inner cavity is in fluid communication with the fluid chamber through at least one of a plurality of pathways from the underside of the substrate die to the upper surface of the substrate die.

35. The display device according to claim 29, wherein the body comprises surface area extending elements.

36. The display device according to claim 29, comprising a septum arranged in one of the fill port or the evacuate port.

37. A die carrier, comprising:
a body at least partially defining a fluid chamber, the body having a primary surface adapted for attachment to a substrate die;
means for defining a first fluid path to the fluid chamber filling the fluid chamber; and
means for defining a second fluid path to the fluid chamber.

38. The die carrier according to claim 37, comprising means for preventing fluid from leaving the fluid chamber through at least one of the first fluid path to the fluid chamber or the second fluid path to the fluid chamber.

39. A die carrier, comprising:
a body having a primary surface adapted for attachment to a substrate die and at least partially defining a fluid chamber;
a fill port fluidically connected to the fluid chamber;
an evacuate port fluidically connected to the fluid chamber; and
means for accommodating thermal expansion of fluid in the fluid chamber.

* * * * *